(12) United States Patent
Kai et al.

(10) Patent No.: US 6,238,828 B1
(45) Date of Patent: May 29, 2001

(54) PRINTING METHOD

(75) Inventors: Keiji Kai, Osaka; Takaaki Kiyose, Nara, both of (JP)

(73) Assignee: Kokuyo Co., Ltd. (JP)

( * ) Notice: Subject to any disclaimer, the term of this patent is extended or adjusted under 35 U.S.C. 154(b) by 0 days.

(21) Appl. No.: 09/658,567

(22) Filed: Sep. 8, 2000

Related U.S. Application Data

(62) Continuation of application No. 09/083,948, filed on May 26, 1998, now Pat. No. 6,159,650, which is a continuation-in-part of application No. 08/682,628, filed as application No. PCT/JP95/02711 on Oct. 30, 1996, now abandoned.

(30) Foreign Application Priority Data

Dec. 27, 1994 (JP) ..................................... 6-324596

(51) Int. Cl.[7] ............... G03C 5/16; G03C 5/56
(52) U.S. Cl. .................. 430/17; 430/9; 430/332; 430/334; 430/346; 430/967
(58) Field of Search ..................... 430/139, 332, 430/334, 346, 967, 396, 9, 17

(56) References Cited

U.S. PATENT DOCUMENTS

| | | |
|---|---|---|
| 2,844,734 | 7/1958 | Hartmann . |
| 3,501,303 | 3/1970 | Foltz et al. . |
| 4,460,676 | 7/1984 | Fabel . |
| 4,764,948 | 8/1988 | Hurwitz . |
| 4,948,705 | 8/1990 | Throgmorton . |

FOREIGN PATENT DOCUMENTS

| | | |
|---|---|---|
| 49-1574 | 1/1974 | (JP) . |
| 57-198900 | 12/1982 | (JP) . |
| 58-101159 | 6/1983 | (JP) . |
| 62-277641 | 12/1987 | (JP) . |
| 4-103048 | 4/1992 | (JP) . |

Primary Examiner—John A. McPherson
(74) Attorney, Agent, or Firm—Banner & Witcoff, Ltd.

(57) ABSTRACT

A printing method directed to a plurality of pieces of slip paper which have been bound into a book and to the outer surface, of which ink containing an initiator and either one of coloring matter and a precursor of coloring matter is applied are placed. A printing plate has a through portion through which radiation penetrates and whose shape corresponds to a pattern to be printed. The printing plate is placed ont he stacked slip paper and X-rays are irradiated upon the printing plate fro the above direction so as to print the pattern of a character on each pieces of the slip paper at a desired are thereof.

10 Claims, 17 Drawing Sheets

PRINTING METHOD

This application is a continuation of Ser. No. 09/083,948, filed on May 26, 1998, now U.S. Pat. No. 6,159,650, which is a continuation-in-part of Ser. No. 08/682,628 filed on Oct. 30, 1996, now abandoned which was a 371 of PCT/JP95/02711 filed on Dec. 27, 1995.

TECHNICAL FIELD

This invention relates to a printing method, and particularly to a printing method which is preferably used for printing a desired pattern such as a character and a diagram on the outer surface of each of a plurality of stacked materials made of paper, resin, wood or rubber, clothes, food or the like or on both the outer surface and the internal tissues of thick materials made of paper, resin, wood or rubber, clothes, food or the like.

BACKGROUND ART

Conventionally there are several printing methods from a primary one such as to transfer ink applied to a printing plate into a surface of paper to a state-of-the-art one such as an application of photograph technique.

However, it is general for any of the conventional printing methods that printing is provided for a material to be printed one after another or that printing is provided for a continuous material to be printed and then the printed material is cut at a predetermined position one by one. Therefore, it has been difficult to print a company name or a company logotype on a material to be printed such as a slip pad after each pieces of paper has been bound into a book.

In addition, with the conventional printing methods printing is provided only for the outer surface of the material to be printed. Then it has been impossible for an application of a conventional printing technique to manufacture an article whose every cross section is printed with the same diagram or character such as "Kintaro candy" which is a bar-shaped candy whose every cross section has the same boy's face. This kind of product is manufactured by binding bar-shaped materials each of which has a different color and which are arranged parallel in a predetermined order and integrally uniting them. As a result of this, it is difficult to express a minute diagram or character.

The object of the invention is to provide an epockmaking printing method which can easily solve the above-mentioned problems.

DISCLOSURE OF INVENTION

To attain the above-mentioned object the invention has the following structure. The printing method in accordance with the invention is characterized by that a plurality of materials to be printed having a reacting species A at least on the outer surface thereof are stacked, and that radiation B which has penetrability and can develop, change or fade a color of the reacting species A is irradiated upon the materials to be printed toward the stacked direction so as to print generally the same pattern on each of the materials to be printed.

The invention is applied to articles of not only bound paper but also loose paper or other materials such as resin. The articles of bound paper are represented by, for example, a slip pad, a carbon-copied slip pad, a note book, a scratch pad, a calendar, an album, an address book, a telephone directory, a book, a news paper, an account book, a writing pad, a sum pad, a reporting pad, a scrapbook, a file or the like. In these articles of bound paper, paper constituting each pages or a mount of the article is the material to be printed in accordance with the invention. The articles of loose paper are represented by, for example, copy paper, heat-sensitive paper, sensitized paper, heat transferred-system paper for word processors, loose-leaf paper, drawing paper, tracing paper, a paper board, a corrugated box, an envelope, a greeting card, a post card, a name card, a label, a seal, a poster, or the like. The other materials made of resin or the like are represented by a file, a binder, a clear book, a clear holder, a film for over head projector, a desk pad, a ruler, a vinyl tape, a plastic board, a bag of polyvinyl chloride, a photograph, a roll of film, a plywood, an aluminum sheet, clothes such as a shirt and a handkerchief, or food such as a sliced piece of bread and cheese.

The printing method in accordance with the invention is characterized by that a material to be printed having a reacting species A both on the outer surface thereof and the internal tissues thereof is placed in a predetermined position, and that radiation B which has penetrability and can develop, change or fade a color of the reacting species A is irradiated from a certain direction upon the material to be printed so as to print generally the same pattern on both the surface and the internal of the material to be printed.

The material to be printed having a reacting species A on not only the outer surface thereof and but also the internal tissues thereof is represented by an eraser or food such as a candy which is cut or broken when eaten, bread, semicylindrical boiled fish paste and cheese.

The radiation B used in the printing method in accordance with the invention is preferably represented by X-rays. Followings are two preferable methods for irradiating radiation B. The first method is to form a through portion through which the radiation B penetrates and whose shape corresponds to a predetermined pattern on a printing plate which can prevent the radiation B from penetrating and then to irradiate the radiation B upon the material to be printed through the printing plate. The second method is to irradiate the radiation B in a beam and to move the position upon which the radiation B is irradiated corresponding to a pattern to be printed.

The reacting species A is represented by that comprising a substance which contains coloring matter C1 or a precursor of coloring matter C2 and which can be changed in its state of electron when the radiation B is irradiated thereupon. In this case, the reacting species A is changed in its state of electron when the radiation B is irradiated thereinto, thereby making a intermediate such as a cation and an electron, a cation and an anion, and a radical and a radical, leading a new reactions and developing a color of the precursor of coloring matter C2 or changing or fading a color of the coloring matter C1 so as to display a predetermined pattern. The reacting species A is represented by that comprising, for example, coloring matter C1 alone, a precursor of coloring matter C2 alone, coloring matter C1 and a catalyst D as an initiator F, a precursor of coloring matter C2 and a catalyst D, coloring matter C1, a catalyst D as an initiator F and a reacting substrate E, or a precursor of coloring matter C2, a catalyst D and a reacting substrate E. In this case, all or part of the coloring matter C1 and the initiator F or all or part of the precursor of coloring matter C2 and the initiator F is changed in its state of electron when the radiation B is irradiated thereupon, thereby making a intermediate as shown in FIG. 1, leading a new reaction, and developing a color of the precursor of coloring matter C2, or changing or fading a color of the coloring matter C1.

Reaction patterns of a reacting species A can be represented by the reaction pattern of color development as shown in FIG. 2 and the reaction pattern of color change or fading as shown in FIG. 3.

As reaction patterns of color development as shown in FIG. 2, there is a case that a single molecule changes its structure to form a color developing structure in dyestuffs thereby to bring about a reaction of color development and the other case that a plurality of molecules are polymerized or decomposed to form a color developing structure in dyestuffs thereby to bring about a reaction of color development. The reacting species A is, as shown in FIG. 2, composed of a single material or of a plurality of different materials. As a case that the reacting species A is composed of a single material there can be represented by, for example, that comprising a precursor of coloring matter C2 such as diacetylene carboxylic acid. As a case that the reacting species A is composed of a plurality of different materials there can be represented by, for example, that comprising an initiator F such as an onium salt, a phenol derivative, an initiator for electron resist, an initiator of polymerization (cation, anion or radical), an initiator for ultraviolet and scintillator, and a precursor of coloring matter C2 such as triphenylmethane leuco bases, triphenylmethane phthalides, fluorans and spiropyrans. As to how the initiator F works, there is a case that a radical or an ion (generated from acidic or basic compounds) is generated by irradiating radiation B such as X-rays upon the initiator F, as a result of this an action of polymerization or decomposition of the precursor of coloring matter C2 is brought about, another case that secondary irradiated light is generated by irradiating radiation B such as X-rays upon the initiator F, and the secondary irradiated light brings about an action of polymerization, decomposition, or structural change of the precursor of coloring matter C2 and the other case that a radical or an ion (generated from acidic or basic compounds) is generated by the above-mentioned secondary irradiated light, as a result of this an action of polymerization, decomposition or structural change of the precursor of coloring matter C2 is brought about.

On the other hand, as reaction patterns of color change or fading as shown in FIG. 3, there is a case that a single molecule changes its structure to form a color developing structure in newly formed dyestuffs thereby to bring about a reaction of color change, or to destroy a color developing structure in the dyestuff thereby to bring about a reaction of color fading, and the other case that a plurality of molecules are polymerized or decomposed to form a color developing structure in dyestuffs, thereby to bring about a reaction of color change or to destroy a color developing structure in dyestuffs to bring about a reaction of color fading. The reacting species A is, as shown in FIG. 3, composed of coloring matter C1 alone or of an initiator F and coloring matter C1. As to how the initiator F works, there is a case that a radical or an ion (generated from acidic or basic compounds) is generated by irradiating radiation B such as X-rays upon the initiator F, as a result of this an action of polymerization, decomposition or structural change of the coloring matter C1 is brought about, another case that secondary irradiated light is generated by irradiating radiation B such as X-rays upon the initiator F, and the secondary irradiated light brings about an action of polymerization, decomposition, or structural change of the coloring matter C1, and the other case that a radical or an ion (generated from acidic or basic compounds) is generated by the above-mentioned secondary irradiated light, as a result of this an action of polymerization, decomposition or structural change of the coloring matter C1 is brought about.

Therefore, in accordance with the invention, when the radiation B such as X-rays is irradiated upon a plurality of stacked pieces of the material to be printed, the radiation B penetrates all pieces of the material to be printed, and in the course of this process the reacting species A contained in each pieces of the material to be printed develops, changes or fades a color under generally the same condition. This makes it possible to print generally the same pattern on each pieces of the material to be printed at a time. Therefore, this makes it possible to print a pattern on a desired position of each pieces of paper constituting a slip pad which has already been bound into a book or a notebook. In addition, when applied to a paper goods which has not been bound into a book or other stackable materials, a plurality of materials to be printed can be printed at a time. As a result of this, it takes less time to print a plurality of materials by the printing method in accordance with the invention than by conventional methods.

Further, if the reacting species A is contained in not only the outer surface of the material to be printed but also the internal tissues thereof, the radiation B irradiated upon the thick material to be printed penetrates the material to be printed. The reacting species A existing on the outer surface of the material to be printed and in the internal tissues thereof therefore develops, changes or fades the color at a time. Then generally the same pattern is printed both on the outer surface of the material to be printed and inside thereof. As a result of this, same pattern is to be shown to any cross sections if the material to be printed is cut parallel to the outer surface on which the pattern is printed. Consequently, this printing method in accordance with the invention makes it possible to show a character or a diagram more clear than it used to be if applied to an article such as a candy inside of which has been possible to print because of the manufacturing method. This printing method in accordance with the invention enables printing the inside of a material which used to be difficult or impossible for reasons of a manufacturing technical skill.

If X-rays are used as radiation, in penetrating the material to be printed, attenuation, diffusion, reflection and deflection of the X-rays is especially lessened, thereby making it possible to print stable and clear patterns.

BRIEF DESCRIPTION OF DRAWINGS

FIG. 5 is a front view of a sheet of the slip paper showing the embodiment.

FIG. 8 is a front view of a sheet of the slip paper showing the result of printing in accordance with the embodiment.

BEST MODE FOR CARRYING OUT THE INVENTION

An embodiment of the invention will now be described with reference to FIGS. 4 through 8.

Figure 4:
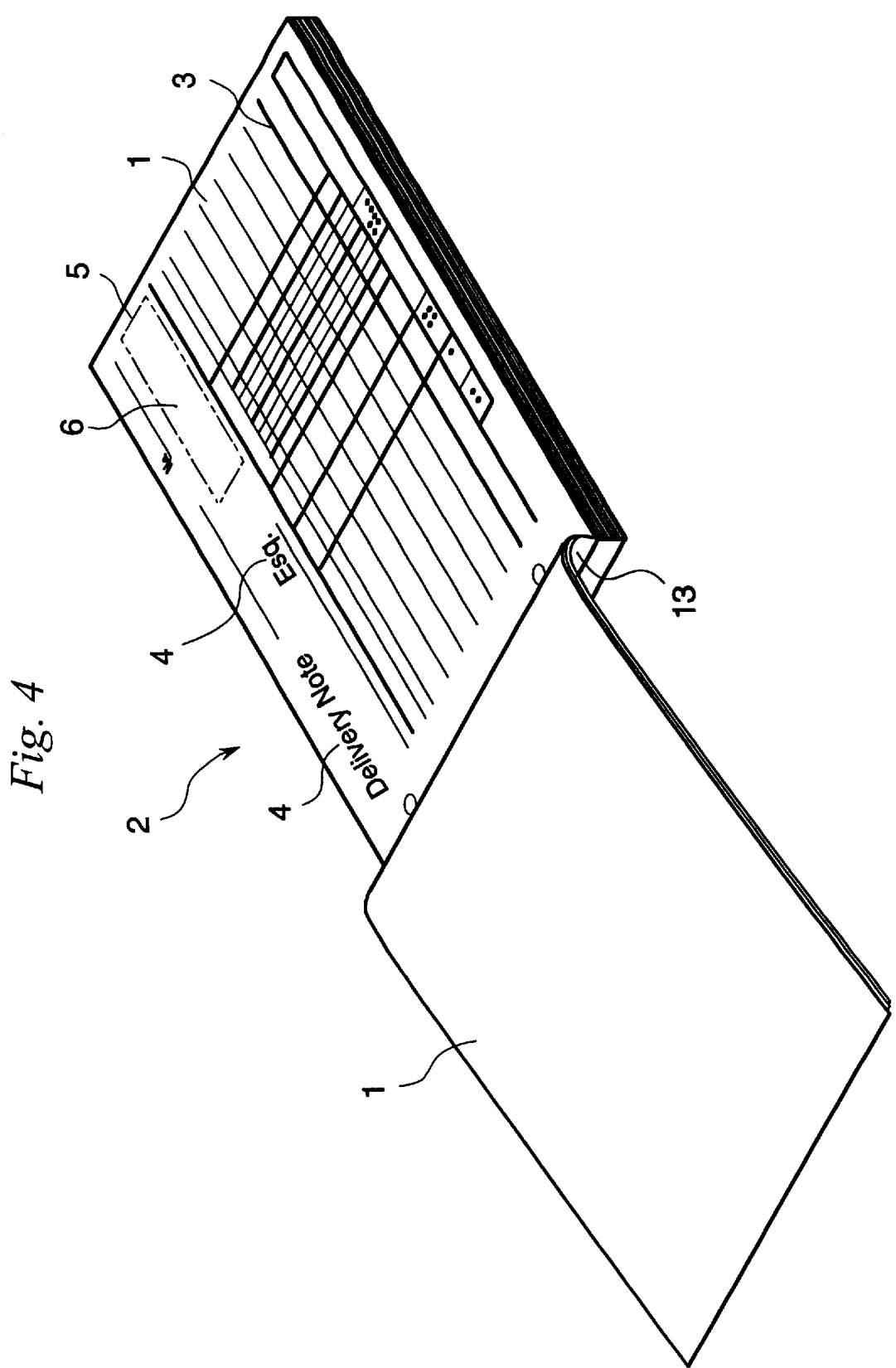
FIG. 4 is a perspective view showing a preferred embodiment of this invention.

In this embodiment, the material to be printed is a plurality of pieces of slip paper 1 which have already been bound into a book. More particularly, the slip pad 2 shown in FIG. 4 is made by binding a plurality of pieces of slip paper 1 with each other stacked upon and each pieces of slip paper 1 is printed with general-purpose rulings 3 or a character 4 by means of an ordinal printing method.

Figure 1:
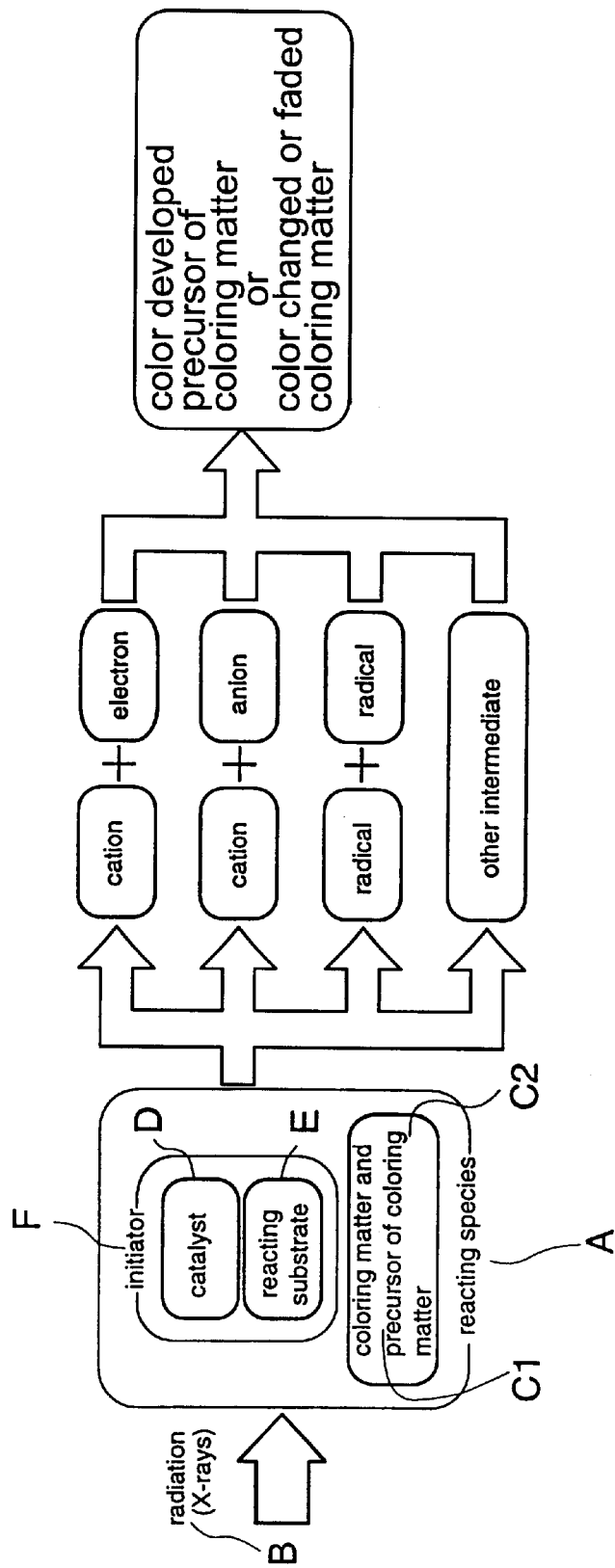
FIG. 1, 2 and 3 are diagrams, each of which shows how the present claimed invention operates.
Figure 2:
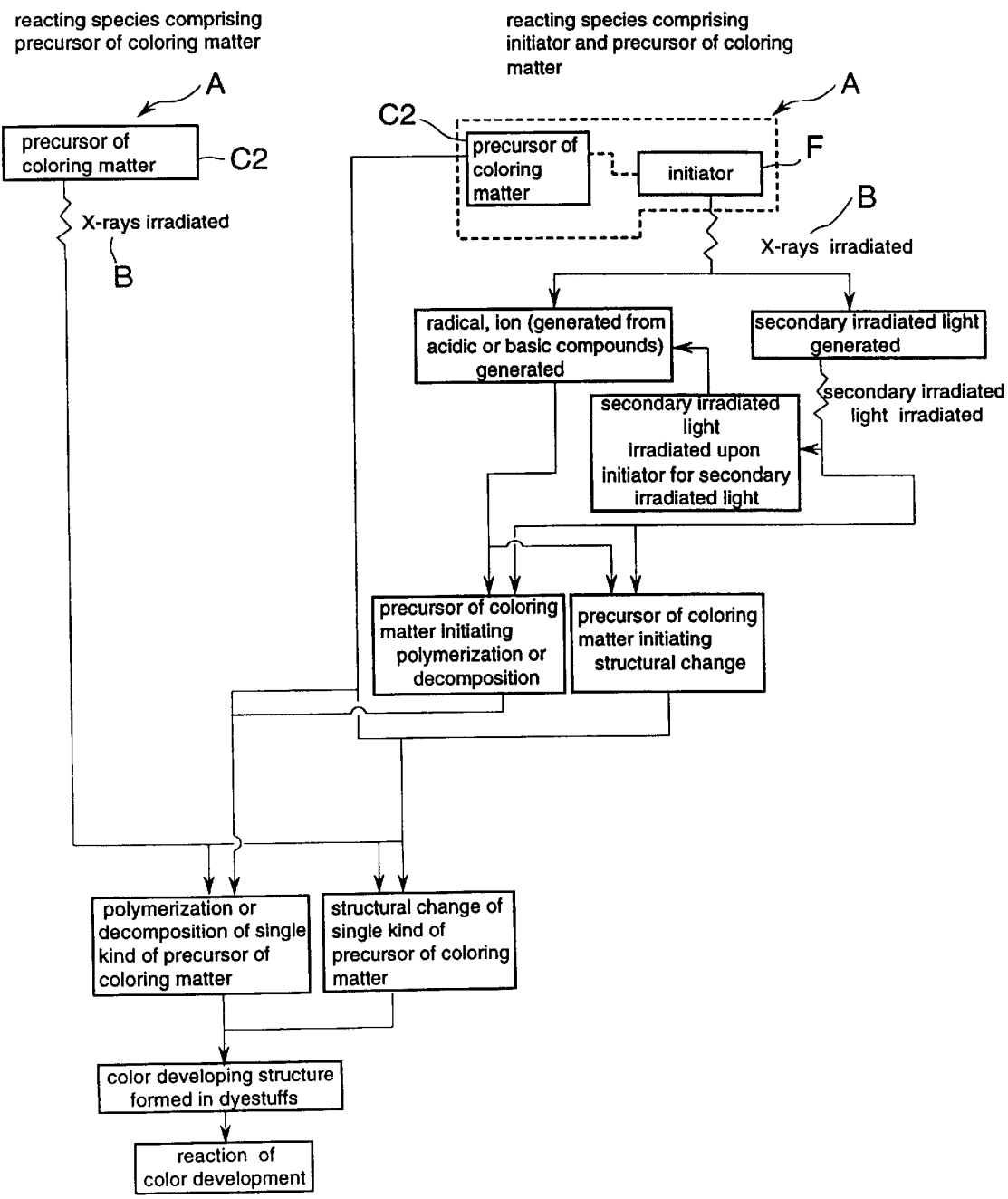
Figure 3:
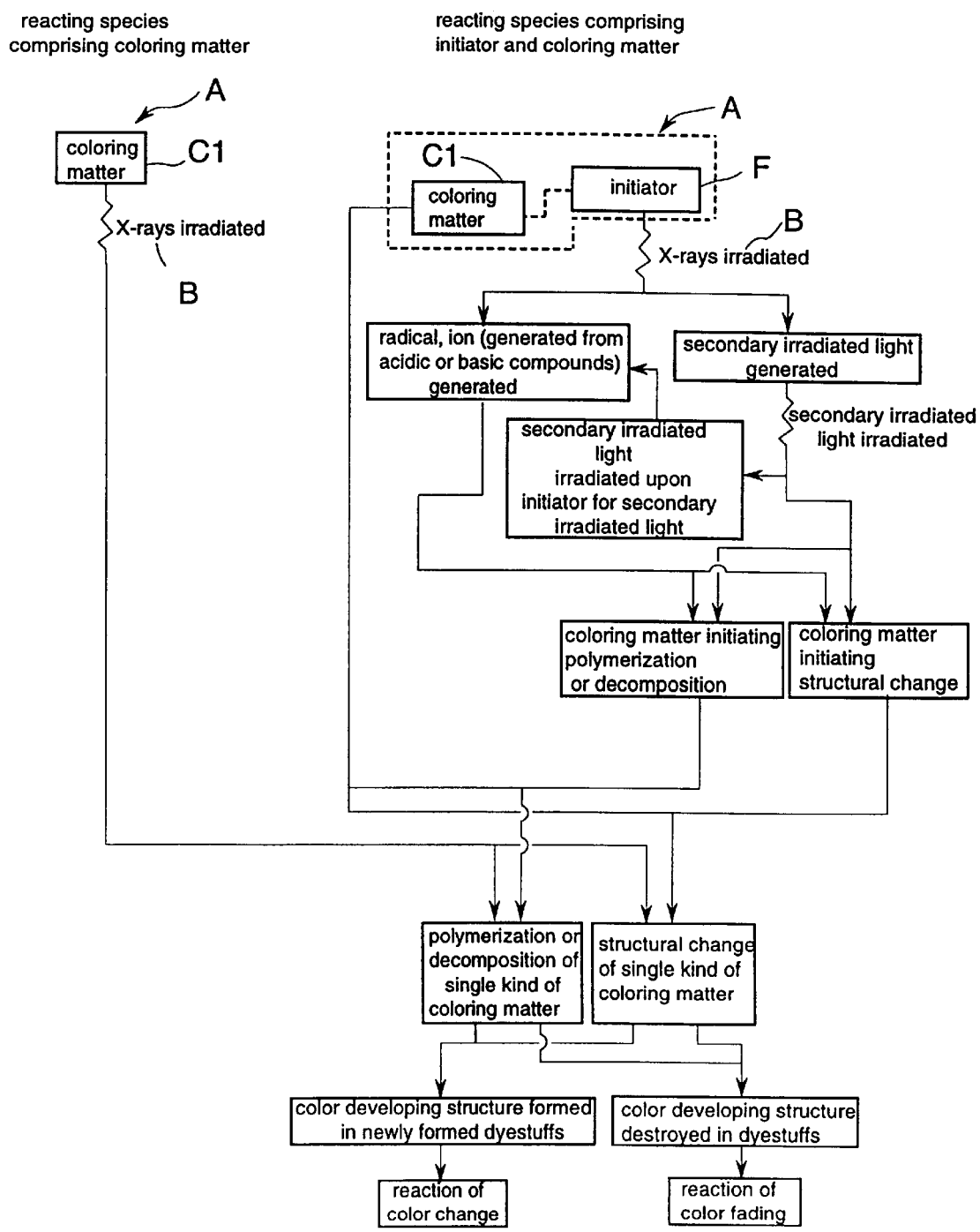
Figure 5:
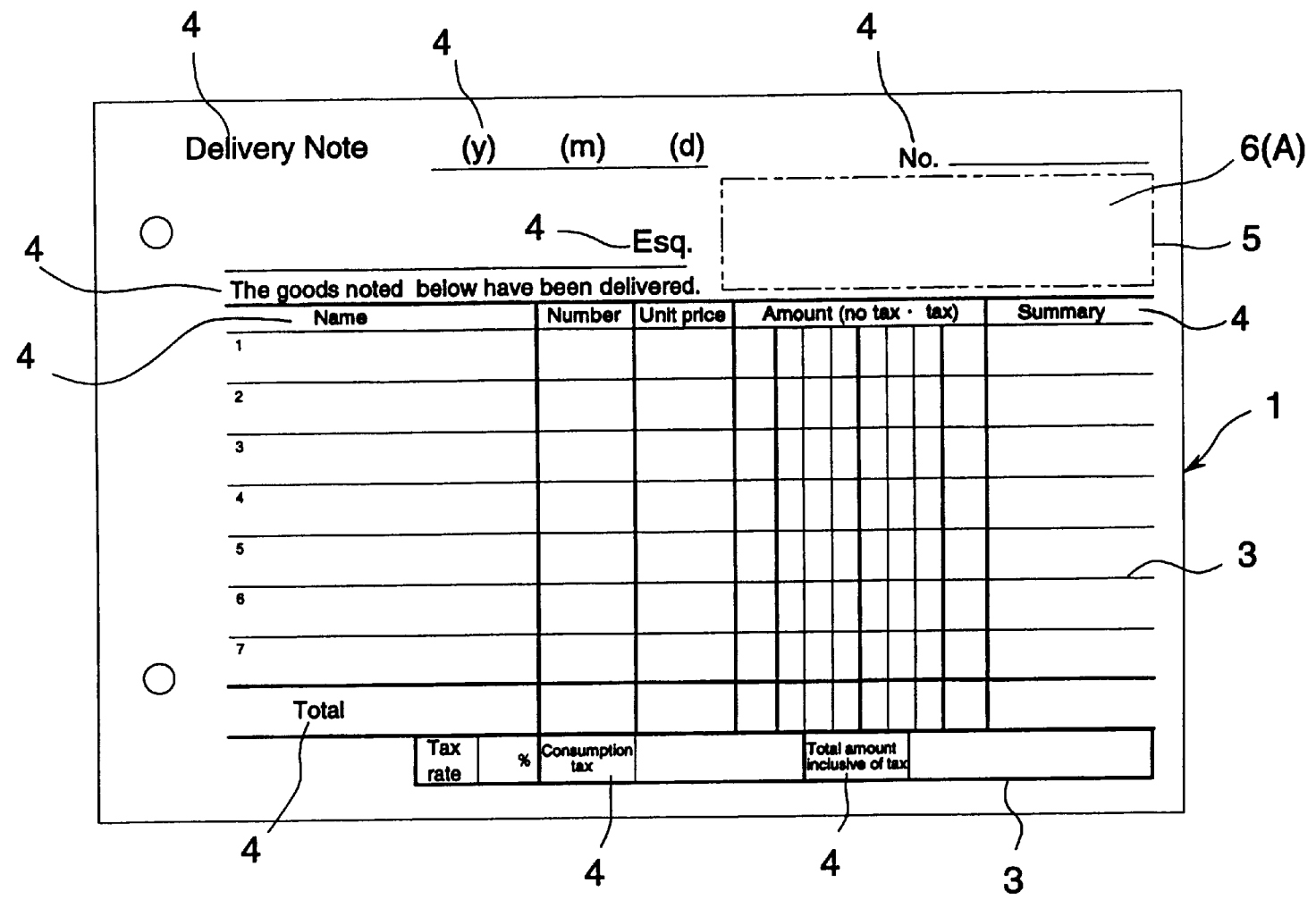

A reacting species A, more particularly, ink 6 containing an initiator F (a catalyst D or a reacting substrate E) and the precursor of coloring matter C2 is applied to a desired area of each pieces of slip paper 1 of the slip pad 2 as shown in FIG. 5, for example, to an area 5 on which a name of a person issuing the slip is to be described. As the initiator F and the precursor of coloring matter C2 any one of the substances which bring about a reaction pattern of color development shown in FIG. 2 may be selected to get a desired color development. More particularly, for example, if the ink 6 is made of diacetylene carboxylic acid as the precursor of coloring matter C2 dissolved into trichloroethane, the portion upon which the X-rays B are irradiated turns into blue because of color development. (This is a case that a reacting species A is comprised of a precursor of coloring matter C2.) The color development could be confirmed to the 150th of the stacked slip paper 1. No change in blue has been found in approximate 240 days after the color development. For another case the ink 6 may be made of polyvinyl alcohol dispersed with methylviologen as the precursor of coloring matter C2. In this case the portion upon which the X-rays B are irradiated also turns into blue because of color development. (This is a case that a reacting species A is comprised of an initiator F and a precursor of coloring matter C2.) The above-mentioned ink 6 is preferably applied when the general-purpose portions such as rulings 3 are printed.

Figure 6:
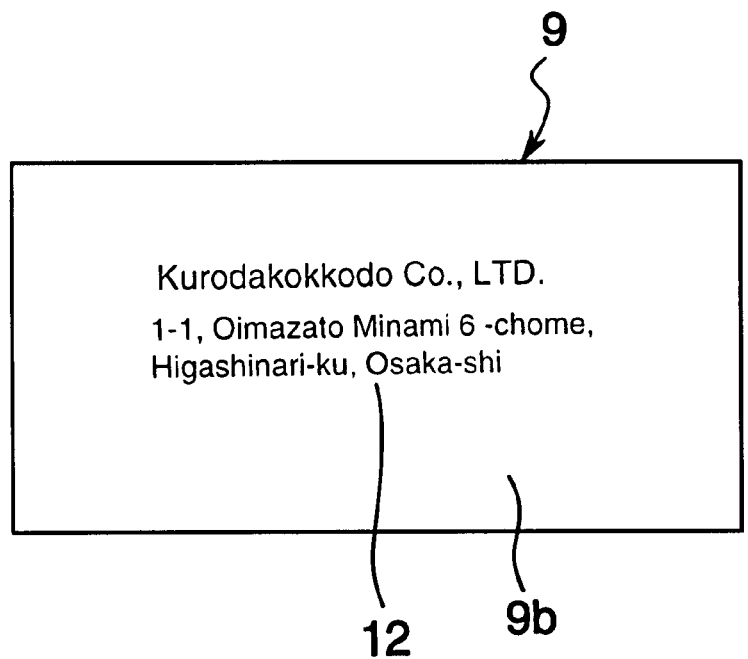
FIG. 6 is a front view showing a printing plate of the embodiment.
Figure 7:
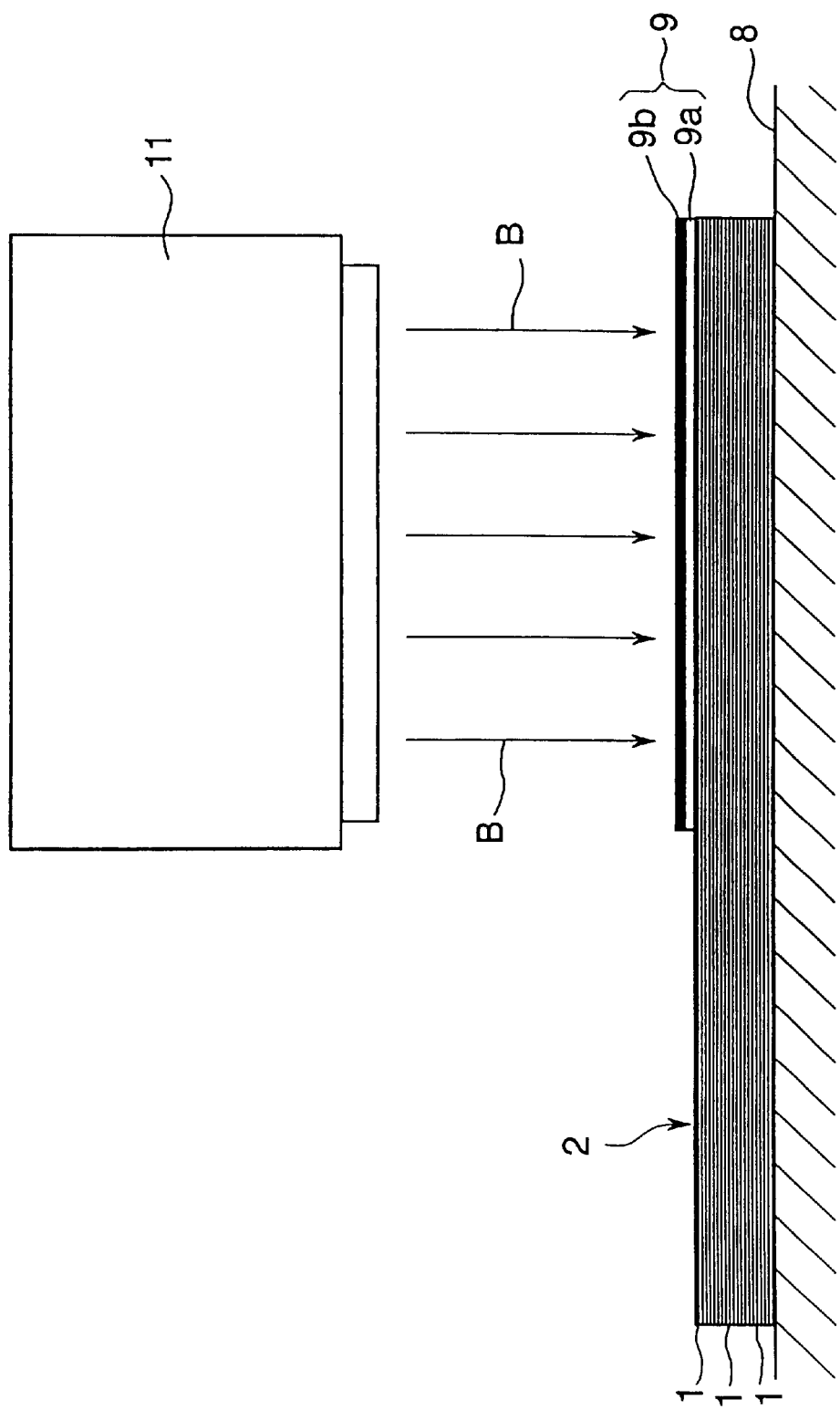
FIG. 7 is a schematic view showing a printing method of the embodiment.
Figure 9:
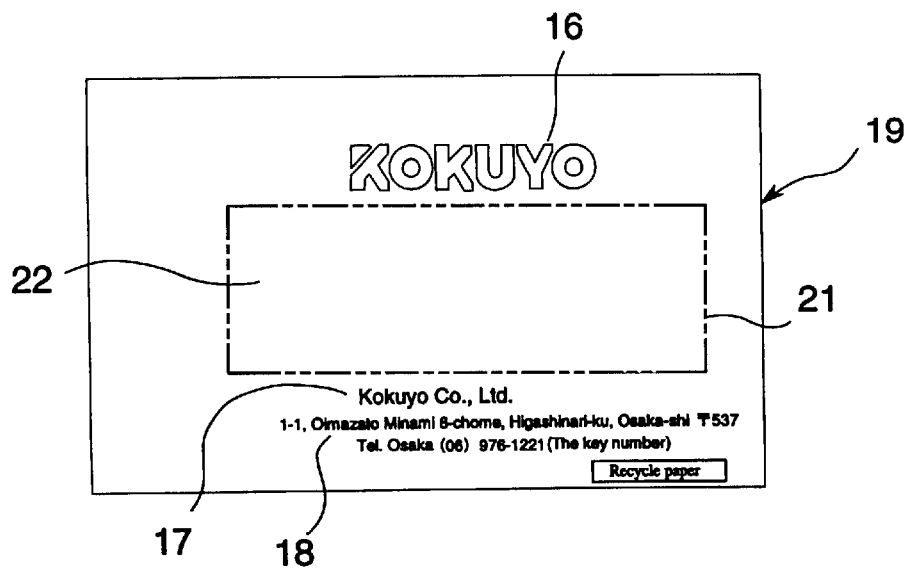
FIG. 9 is a front view showing another preferred embodiment of the invention.
Figure 10:
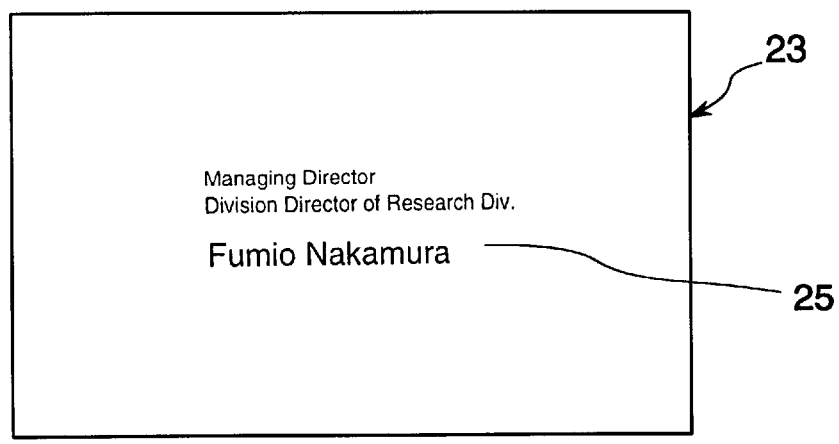
FIG. 10 is a front view showing a printing plate of the embodiment.
Figure 11:
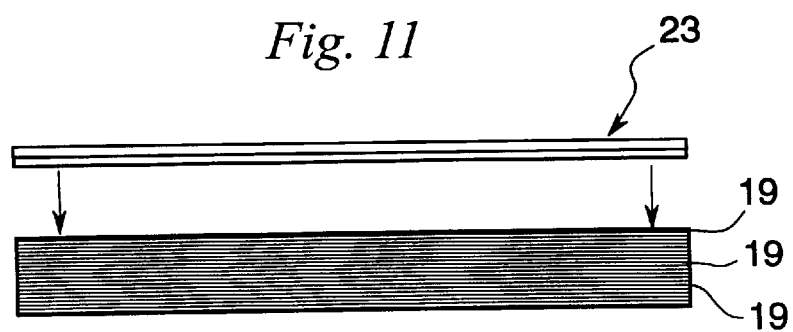
FIG. 11 is a side view showing a step to prepare printing of the embodiment.
Figure 12:
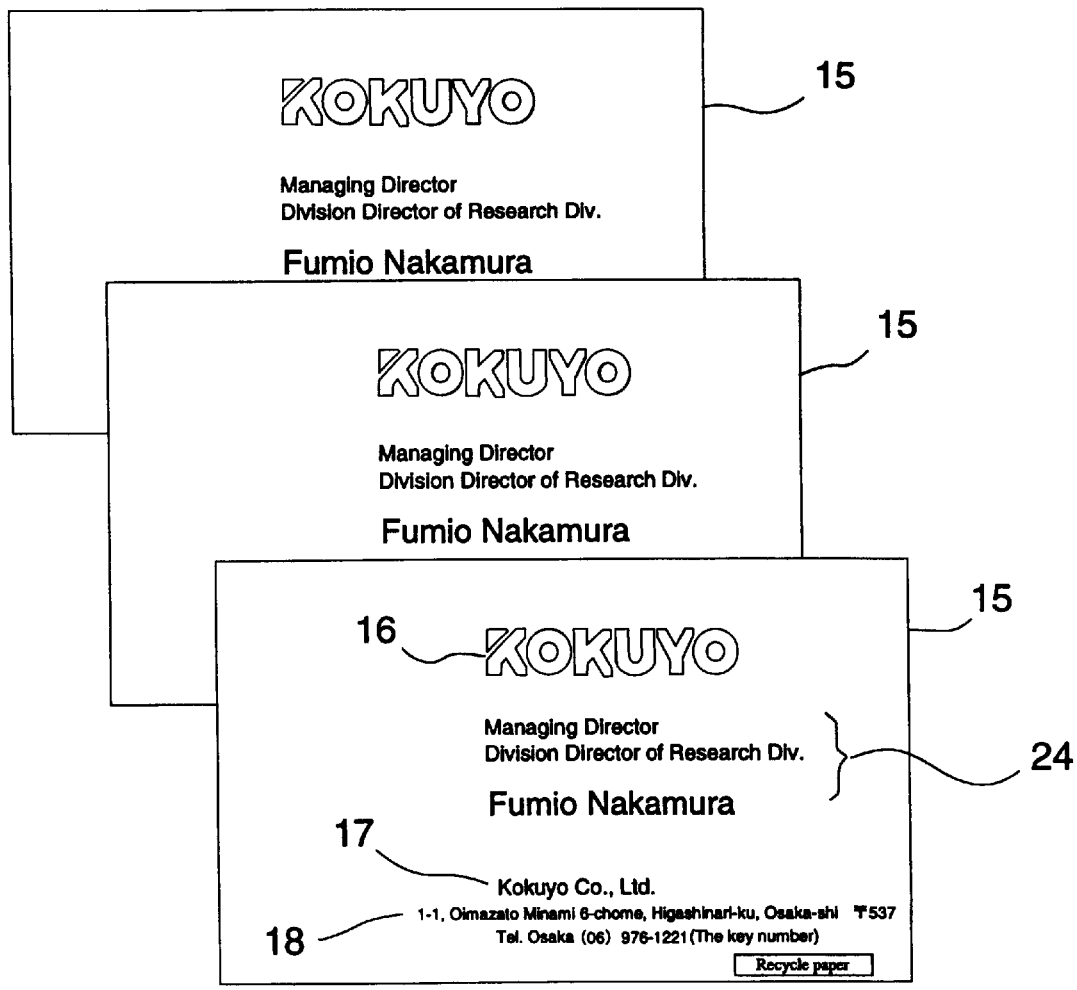
FIG. 12 is a front view showing the result of printing in accordance with the embodiment.

For printing a pattern 7 of a character expressing the address and the name of a person issuing the slip on each pieces of slip paper 1 of the slip pad 2, first arrange the slip pad 2 on a platen 8 as shown in FIG. 7 by using an appropriate positioning device (not shown). Next set a printing plate 9 on the slip pad 2 and irradiate the X-rays B upon the slip pad 2 from an X-ray irradiation device 11 arranged above the printing plate 9. The printing plate 9 is made of, for example, a base 9a of aluminum through which the X-rays B can penetrate and which is coated with a layer 9b of lead which shields the X-rays B and a through portion 12 through which radiation penetrates and whose shape corresponds to the above-mentioned pattern 7 of the character formed at a predetermined area thereof as shown in FIG. 6. Since the fusion point of the base 9a of aluminum is different from that of the layer 9b of lead, it is possible to partially remove the layer 9b of lead alone by a laser processing unit. The through portion 12 whose shape corresponds to the pattern 7 of the character to be printed is formed by making use of this principle. The X-rays B irradiated by the X-ray irradiation device 11 is made of parallel beams and passes through the through portion 12 formed on the printing plate 9 and penetrates through a cover 13 and each pieces of slip paper 1 of the slip pad 2.

Figure 8:
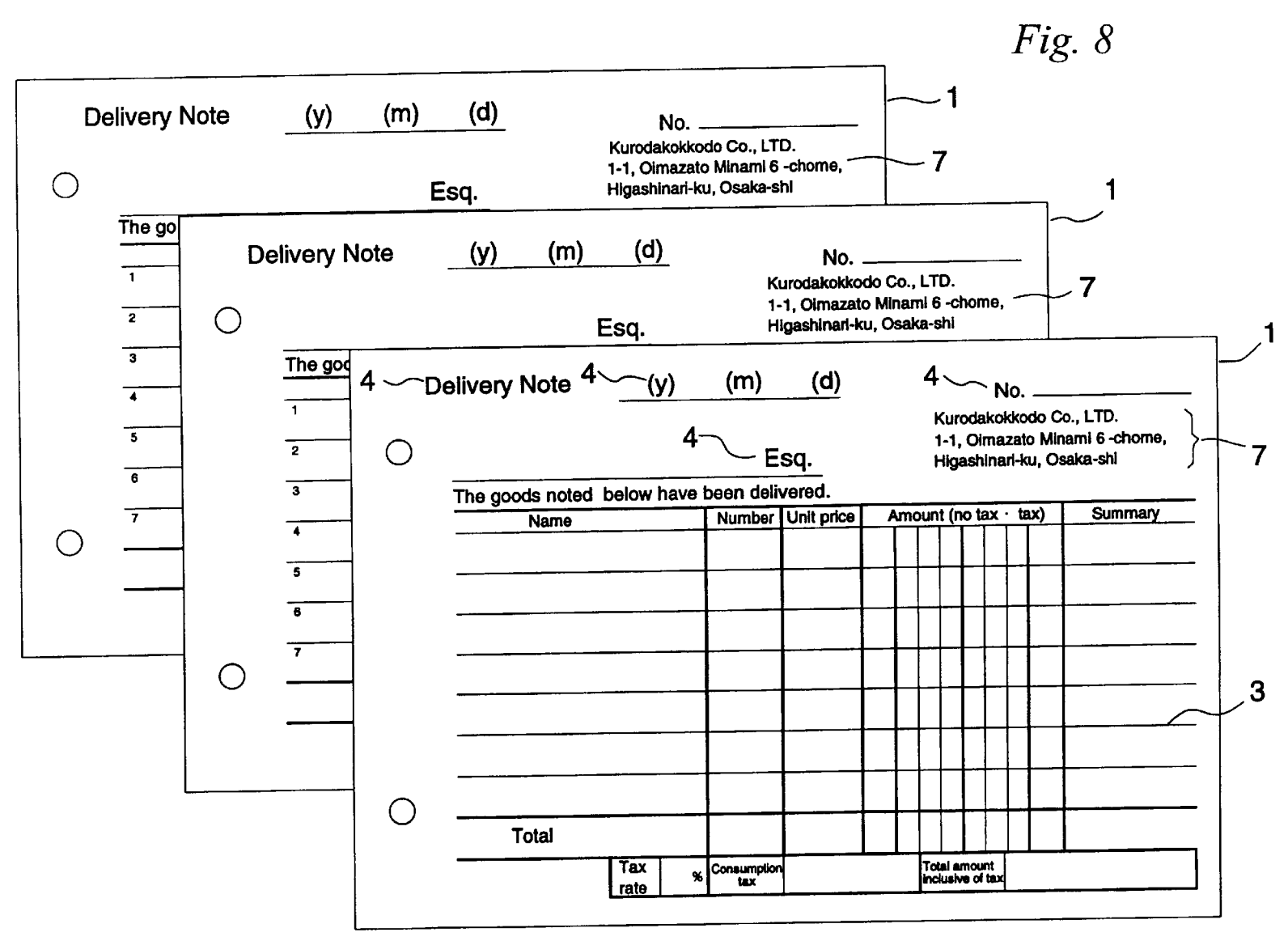

Then only the X-rays B which pass through the through portion 12 of the printing plate 9 penetrates each pieces of slip paper 1 and is irradiated upon the ink 6 having been applied to each pieces of slip paper 1. As a result of this, only the portion which has been exposed to the X-rays B of the ink 6 turns into black, blue or the like because of color development, thereby to print the pattern 7 of the character whose shape corresponds to the through portion 12 of the printing plate 9 on each pieces of the slip paper at a time as shown in FIG. 8.

FIGS. 9 through 12 show another preferred embodiment of the invention. In this embodiment a material to be printed is a name card 15. In this case ink 22 is applied to a desired area 21 of a name card 19 on which only a common part such as a company logotype 16, a company name 17, and the address of a company 18 is printed by an ordinary printing technique. A plurality of the name cards 19 are stacked and a printing plate 23 is placed on the stacked name cards 19. Then X-rays B are irradiated upon the name cards 19 through the printing plate 23. On each of the printing plates 23 formed is a through portion 25 through which radiation penetrates and whose shape corresponds to a pattern 24 of the character showing a post, a title, and a name or the like. Thus the pattern 24 of the character expressing the post, the title, and the name or the like is printed on the area 21 to which ink is applied of each name cards 15 at a time.

Figure 13:
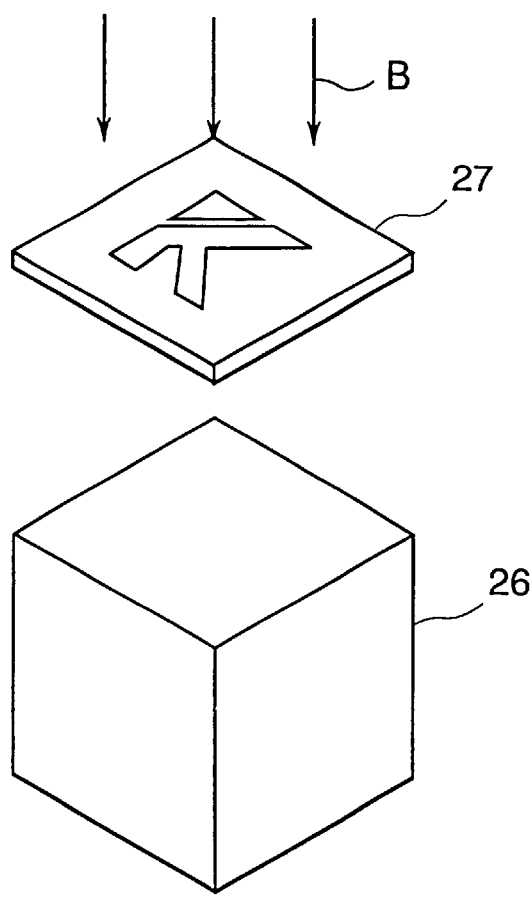
FIG. 13 is a perspective view showing further different embodiment of the invention.
Figure 14:
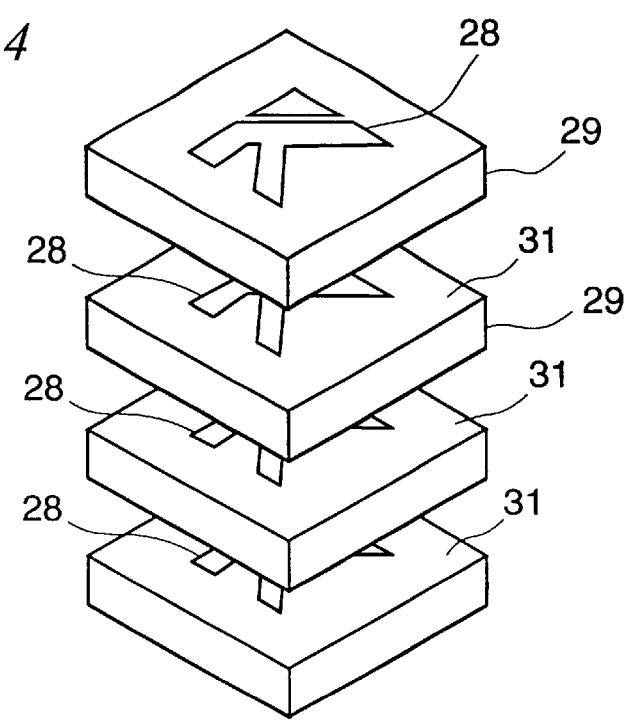
FIG. 14 is a perspective view showing the result of printing in accordance with the embodiment.

FIGS. 13 and 14 show further different preferred embodiment of the invention. In this embodiment a material to be printed is an eraser 26. More particularly, in this embodiment the same pattern 28 is printed on both the outer surface and the internal tissues of the eraser 26 by irradiating X-rays B to the surface of the eraser 26 through a printing plate 27. In this case any one of the above-mentioned reacting species A is to be mixed with the raw material of the eraser 26. Thus printed eraser 26 will show the same pattern 28 in any cross sections 31 thereof when cut into pieces 29.

Figure 15:
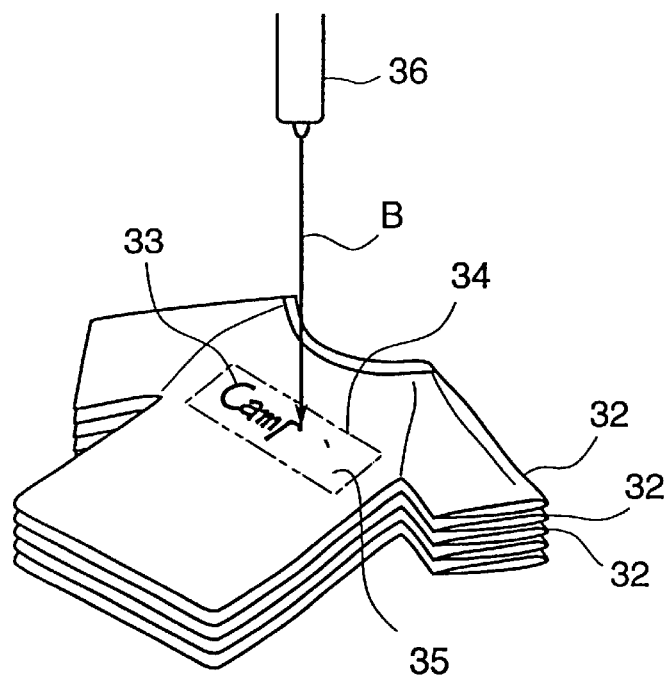
FIG. 15 is a perspective view showing further different embodiment of the invention.
Figure 16:
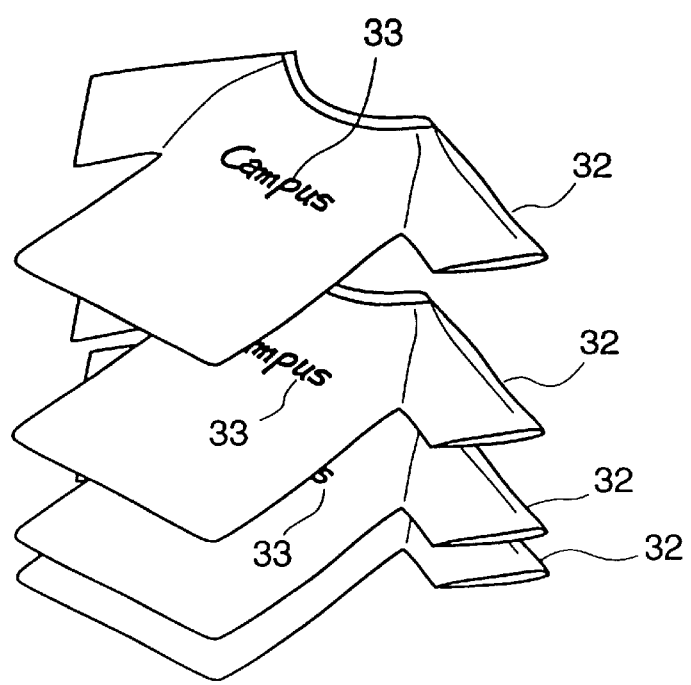
FIG. 16 is a perspective view showing the result of printing in accordance with the embodiment.

FIGS. 15 and 16 show further different preferred embodiment of the invention. In this embodiment, a material to be printed is a T-shirt 32 as clothes. More particularly, in this embodiment a plurality of T-shirts 32 are stacked and a predetermined pattern 33 is printed on each of the T-shirt 32 by irradiating X-rays B upon a predetermined portion. In this case ink 35 containing reacting species a is applied to a desired area 34 of each T-shirts 32 and a required number of T-shirts 32 are stacked. In this embodiment, the X-rays are irradiated in a beam from a head 36 of an X-ray irradiation device and the head 36 moves horizontally so as to print the pattern 33, but a printing plate may of course be used as described in the previous embodiment.

Figure 17:
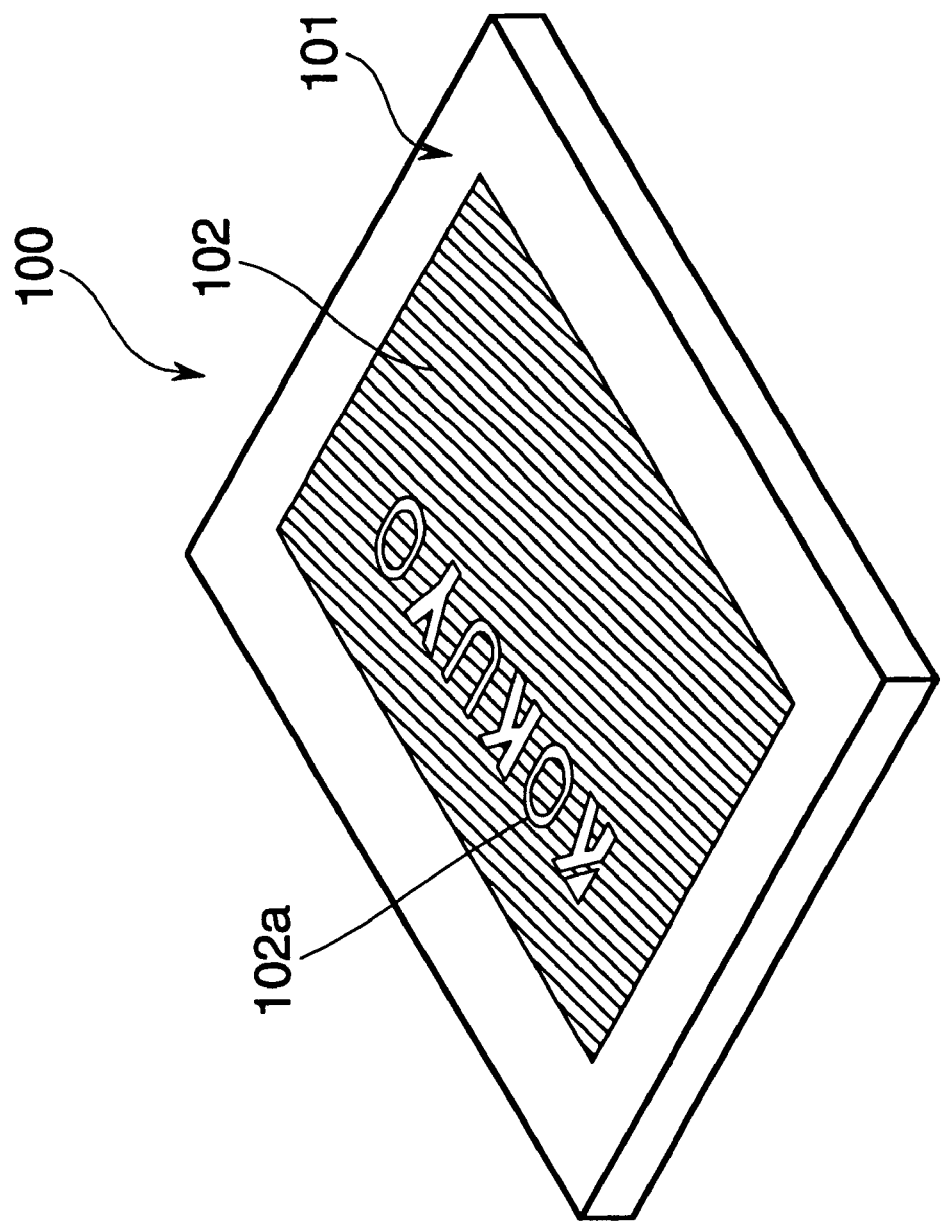
FIG. 17 is a perspective view of a printing plate in accordance with the present invention.

FIG. 17 shows a modification of a printing plate 100. The printing plate 100 is made of acrylic resin as a material having penetrability against radiation and a metal alloy as a material having less penetrability than the acrylic resin, namely, comprises an acrylic base 101 as a first layer and an alloy layer 102 as a second layer. A through portion 102a whose shape corresponds to a predetermined pattern is formed at a predetermined area of the alloy layer 102 by means of the following procedure.

Figure 18:
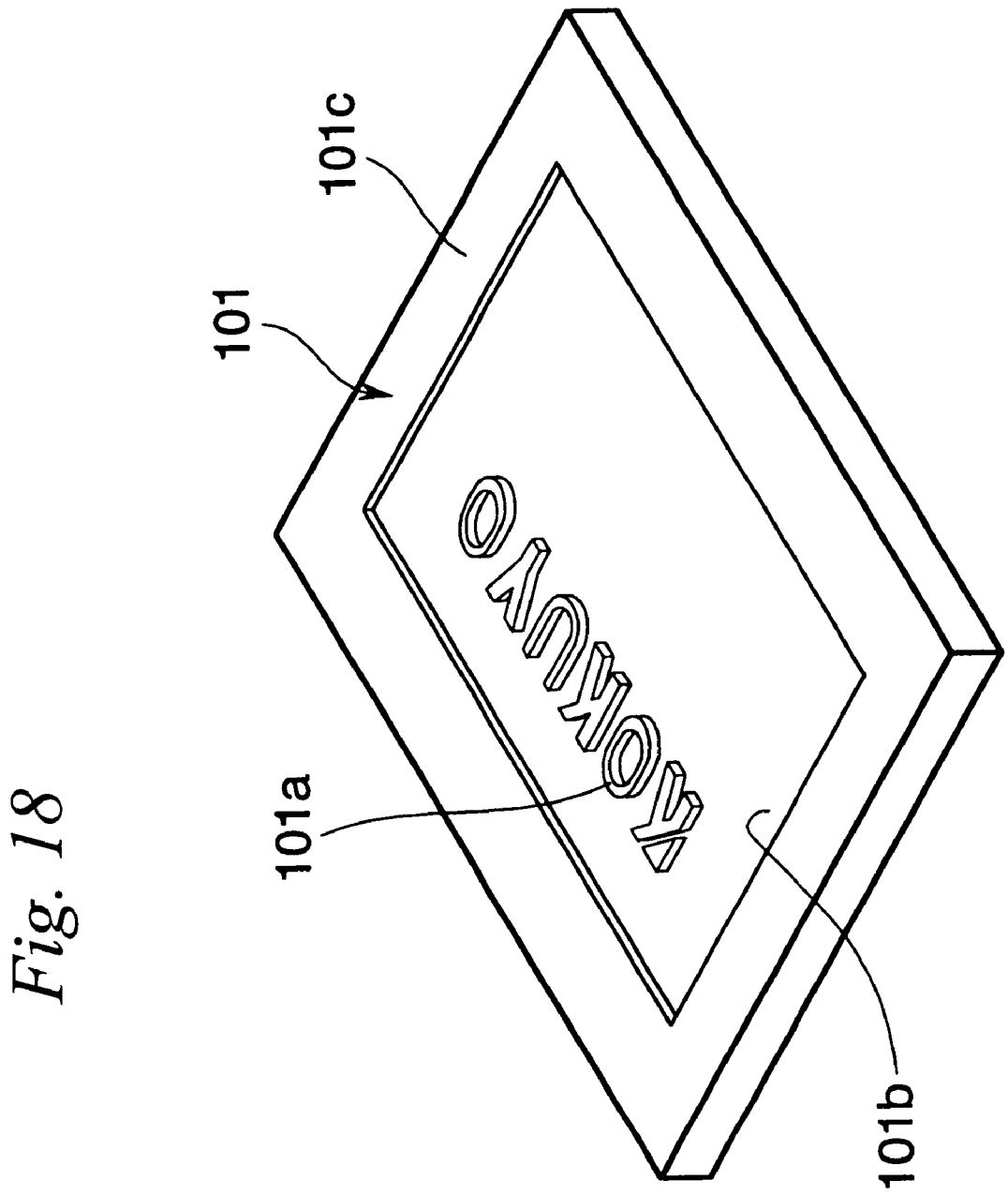
FIG. 18 is a perspective view of a step to prepare the printing plate of FIG. 17.
Figure 19:
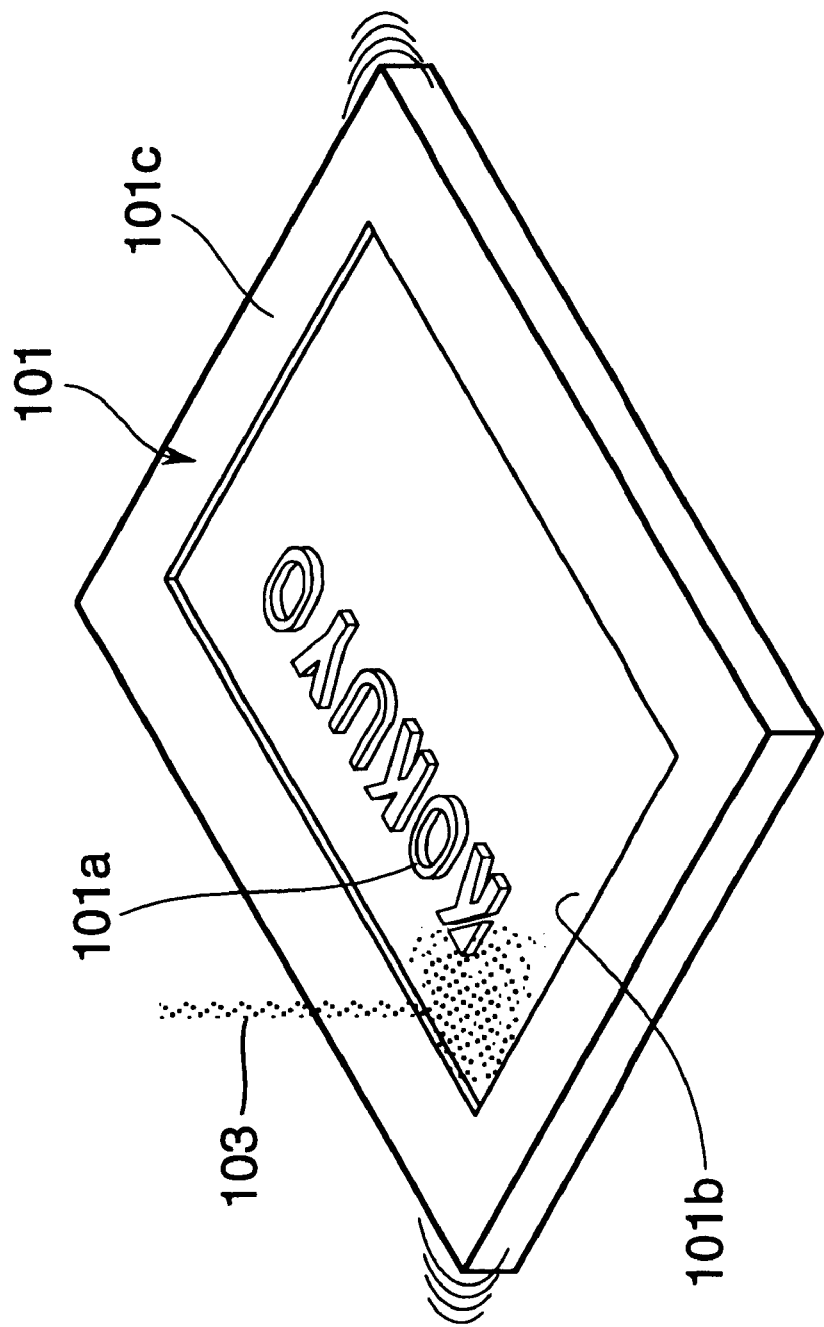
FIG. 19 is a perspective view of a step to prepare the printing plate of FIG. 17.
Figure 20:
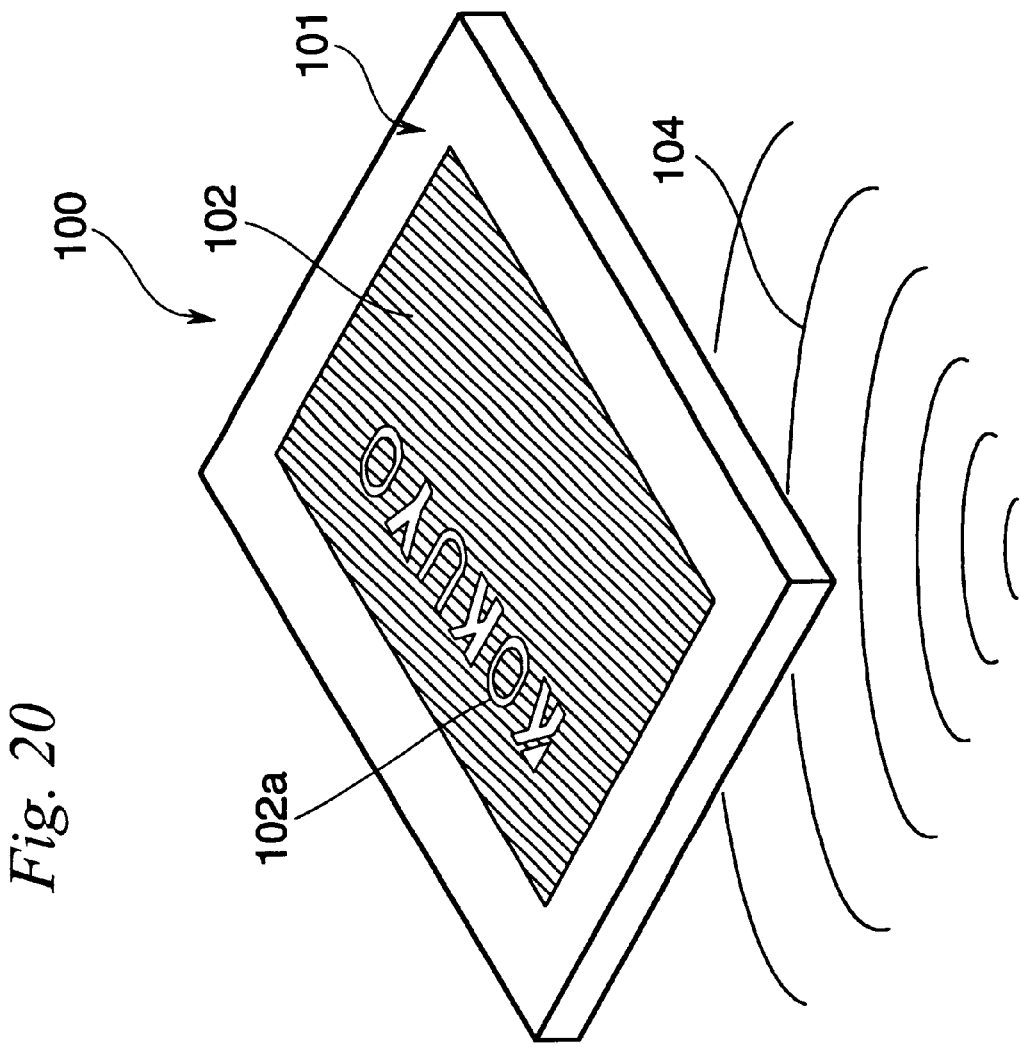
FIG. 20 is a perspective view of a step to prepare the printing plate of FIG. 17.
Figure 21:
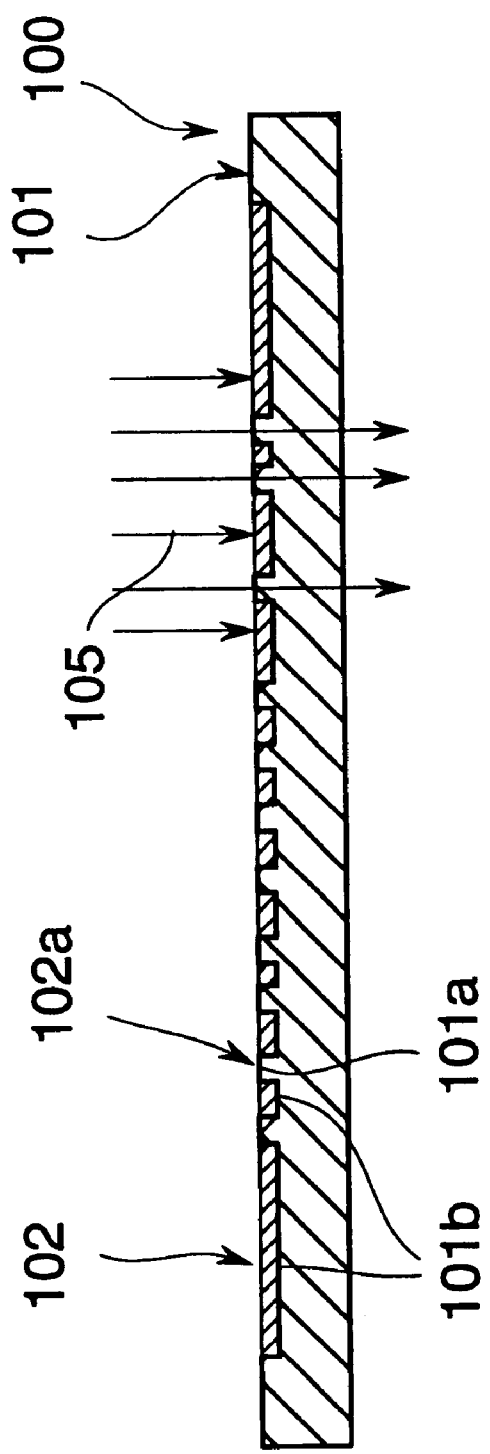
FIG. 21 is a side view of a printing plate of FIG. 17.

First, as shown in FIG. 18, prepare an acrylic base 101 having a uniform thickness and carve a surrounding area 101b which surrounds an area 101a corresponding to the through portion 102a by means of a laser carving so that the area 101b of the acrylic base 101 is concave having generally the same depth and that the area 101a projects upward relatively to the surrounding area 101b. At this time the circumference of the acrylic base 101 remains not to be carved so that a blank 101c is formed to surround the acrylic base 101. Second, fill the surrounding area 101b, namely, a concave portion with a powdery metal alloy 103 uniformly and tightly while vibration is applied to the acrylic base 101, as shown in FIGS. 19 and 20. Next, apply heat 104 with the powdery metal alloy 103 so as to be melt and then cool the metal alloy 103 so as to be solidified again. Finally, grind the surface of the acrylic base 101 so as to remove every possible metal alloy attaching to the surface of the area 101a corresponding to the through portion 102a. Thus the printing plate 100 is completed. In accordance with the arrangement, the alloy layer 102 exists in the surrounding area 101b alone of the acrylic base 101 as shown in FIG. 21. Then the predetermined area is optically transparent against the radiation 105 and functions as the through portion 102a described in the invention.

In accordance with arrangement, it is easy to form a second layer having penetrability against radiation at a predetermined area with accuracy. In this modification, it is needless to say that any suitable resin other than acrylic resin can be used as a material of a first layer and that any suitable alloy or other metal can be used as a material of a second layer.

The invention is not limited to the above-mentioned embodiments. For example, in each of the above-mentioned embodiments, X-rays are used as radiation, but other radiation having penetrability, for example, particle rays such as alpha rays and beta rays, photon rays such as gamma rays, or other electromagnetic waves may be used.

In addition, in the above-mentioned embodiment only the case that a colorless or white precursor of coloring matter develops a color was explained, but there may be another case that the coloring matter changes or fades the color when radiation is irradiated thereon.

INDUSTRIAL APPLICABILITY

The printing method in accordance with the invention is suitable for printing a desired pattern such as a character and a diagram on the outer surface of each of a plurality of stacked materials made of paper, resin, wood or rubber, clothes, food or the like or on both the outer surface and the internal tissues of thick materials made of paper, resin, wood or rubber, clothes, food or the like.

What is claimed is:

1. A printing method comprising placing a material which is cut or broken when used and has a reacting species both on the outer surfaces thereof and in the internal tissues thereof, in a predetermined position, and irradiating the material with radiation that has penetrability and can develop, change, or fade a color of the reacting species, through a printing plate comprising a first layer made of a material having penetrability against the radiation and a second layer made of a material having less penetrability against the radiation than the first layer and which is provided with a through portion through which radiation penetrates and having a shape corresponding to a predetermined pattern at a predetermined area thereof so as to print generally the same predetermined pattern on both the surfaces and the internal tissues of the materials.

2. The printing method of claim 1 wherein the radiation is X-rays.

3. The printing method of claim 1 wherein the reacting species comprises a precursor of coloring matter and wherein the reacting species can be changed in its state of electron when the radiation is irradiated thereupon so as to develop a color of the precursor of coloring matter and can be changed in its state of electron when the radiation is irradiated thereupon so as to change or fade a color of said coloring matter.

4. The printing method of claim 1 wherein the reacting species comprises an initiator which generates an electron, a radical, or an ion when radiation is irradiated thereupon and a precursor of coloring matter which develops a color when reacting with the electron, the radical, or the ion, or that the reacting species comprises an initiator which generates an electron, a radical, or an ion when radiation is irradiated thereupon and coloring matter which changes or fades a color when reacting with the electron, the radical, or the ion.

5. The printing method of claim 1 wherein the reacting species is a precursor of coloring matter which develops a color or coloring matter which changes or fades a color because of change in molecular structure when radiation is irradiated thereupon.

6. A material which is cut or broken when used and comprising a pattern on the outer surfaces and inner tissues thereof formed by subjecting a material having a reacting species both on the outer surfaces thereof and in the internal tissues thereof, in a predetermined position, to radiation that has penetrability and can develop, change, or fade a color of the reacting species, through a printing plate comprising a first layer made of a material having penetrability against the radiation and a second layer made of a material having less penetrability against the radiation than the first layer and which is provided with a through portion through which radiation penetrates and having a shape corresponding to a predetermined pattern at a predetermined area thereof so as to print generally the same predetermined pattern on both the surfaces and the internal tissues of the material.

7. The material of claim 6 wherein the radiation is X-rays.

8. The material of claim 6 wherein the reacting species comprises a precursor of coloring matter and wherein the reacting species can be changed in its state of electron when the radiation is irradiated thereupon so as to develop a color of the precursor of coloring matter and can be changed in its state of electron when the radiation is irradiated thereupon so as to change or fade a color of said coloring matter.

9. The material of claim 6 wherein the reacting species comprises an initiator which generates an electron, a radical, or an ion when radiation is irradiated thereupon and a precursor of coloring matter which develops a color when reacting with the electron, the radical, or the ion, or that the reacting species comprises an initiator which generates an electron, a radical, or an ion when radiation is irradiated thereupon and coloring matter which changes or fades a color when reacting with the electron, the radical, or the ion.

10. The material of claim 6 wherein the reacting species is a precursor of coloring matter which develops a color or coloring matter which changes or fades a color because of change in molecular structure when radiation is irradiated thereupon.

* * * * *

UNITED STATES PATENT AND TRADEMARK OFFICE
CERTIFICATE OF CORRECTION

PATENT NO.   : 6,238,828 B1
DATED        : May 29, 2001
INVENTOR(S)  : Keiji Kai et al.

It is certified that error appears in the above-identified patent and that said Letters Patent is hereby corrected as shown below:

Title page,
Item [62], Related U.S. Application Data, "PCT/JP95/02711 on Oct. 30, 1996" has been replaced by -- PCT/JP95/02711 on Dec. 27, 1995 --.

Signed and Sealed this

Twenty-ninth Day of June, 2004

JON W. DUDAS
*Acting Director of the United States Patent and Trademark Office*